United States Patent [19]

Ballingall, III et al.

[11] Patent Number: 4,911,101

[45] Date of Patent: Mar. 27, 1990

[54] METAL ORGANIC MOLECULAR BEAM EPITAXY (MOMBE) APPARATUS

[75] Inventors: James M. Ballingall, III, Fayetteville; Stephen D. Hersee, Manlius, both of N.Y.

[73] Assignee: General Electric Company, Syracuse, N.Y.

[21] Appl. No.: 221,633

[22] Filed: Jul. 20, 1988

[51] Int. Cl.[4] .............................................. C23C 16/52

[52] U.S. Cl. .................................... 118/715; 118/708; 118/725; 118/726

[58] Field of Search ............... 118/692, 708, 715, 725, 118/726; 427/8, 248.1

[56] References Cited

U.S. PATENT DOCUMENTS

| | | | |
|---|---|---|---|
| 4,436,674 | 3/1984 | McMenamin | 118/726 |
| 4,517,220 | 5/1985 | Rose | 427/248.1 |
| 4,761,269 | 8/1988 | Conger et al. | 118/715 |
| 4,783,343 | 11/1988 | Sato | 118/726 |

OTHER PUBLICATIONS

Tsang, W. T., "Chemical Beam Epitaxy of InP and GaAs", *Appl. Phys. Lett.*, vol. 45, No. 11, (Dec. 1, 1984), pp. 1234–1236.

Brodsky, M. H. and I. Haller, "Method of Preparing Hydrogenated Amorphous Silicon", *IBM Technical Disclosure Bulletin*, vol. 22, No. 8A, (Jan. 1980), pp, 3391–3392.

*Primary Examiner*—Richard Bueker
*Assistant Examiner*—Terry J. Owens
*Attorney, Agent, or Firm*—Richard V. Lang; Fred Jacob; Robert A. Cahill

[57] ABSTRACT

The invention relates to apparatus for epitaxial processing using metal organic molecular beams. The MOMBE apparatus employs a manifold for supplying metal organic vapor to a reactor which is operated under vacuum. The manifold includes a bubbler in which MO vapor is formed and mixed with a carrier gas. The bubbler provides flexible, three parameter control of the MO reagent permitting use with MO reagents of low vapor pressure. A compensation flow is provided parallelling the reagent flow and employing four valves which are ganged and switched so as to supply the MO carrier gas mixture either to the reactor line or to the vent line and maintain equal flows and pressures during this switching operation. The apparatus is capable of forming very thin reproducible epitaxial layers.

6 Claims, 3 Drawing Sheets

METAL ORGANIC MOLECULAR BEAM EPITAXY (MOMBE) APPARATUS

BACKGROUND OF THE INVENTION

1. Field of the Invention

The invention relates to the processing of epitaxial layers upon crystalline substrates, and more particularly to an apparatus for growing epitaxial layers by means of a metal organic molecular beam.

2. Prior Art

The Metal Organic Molecular Beam Epitaxy ("MOMBE") technique is used to grow epitaxial layers upon a semiconductor substrate in the formation of semiconductor devices. The growth takes place upon a heated semiconductor substrate in a growth chamber into which one or more reagents in a gaseous or vapor state are introduced.

The MOMBE reagents are converted to a gaseous or vapor state in a bubbler by passing a carrier gas through a metal organic reagent in liquid form. These reagents are suitable for epitaxial formation and are capable of saturating the small flow of carrier gas as it passes through the bubbler. The carrier borne gaseous MO compounds are then injected into the growth chamber where they decompose into "metallic" and organic components upon encountering the heated substrate. Ideally, the organic component escapes and is removed by the vacuum pumps while the "metallic" component bonds to another "metallic" component on the heated substrate to form the epitaxial layer.

The letter "M" in the acronyms "MOMBE" and "MO", accordingly stands for "metal" but includes elements from Groups II to VI. Group III metals, which bond with Group V semi-metals, form the III–V semiconductor compounds which are more common. Among the III–V compounds are gallium arsenide, aluminum gallium arsenide, gallium indium arsenide, indium phosphide, gallium phosphide, gallium indium phosphide, gallium indium arsenide phosphide, and indium antimonide.

Epitaxial processing, when properly carried out, produces crystalline layers which have uniform lattices, accurate impurity distributions, and accurately gauged thicknesses.

A plurality of differing layers may be required in common semiconductor devices. For instance, in a high electron mobility transistor (HEMT), the final structure consists of five discrete layers, each optimized to enhance transistor performance. The layers include the substrate, which is 20 mils thick, which may be of indium phosphide. The first epitaxially formed layer is also of indium phosphide, and is one micron thick. The first epitaxial layer is followed by one 800 Å layer of gallium indium arsenide, a 400 Å layer of aluminum indium arsenide with a 45 Å undoped underportion, and a final 200 Å layer of gallium indium arsenide.

The performance of the HETT and devices optimized for high frequency performance depends on accuracy-ideally to within an atomic layer - (2–3 Å) in the uniformity of the thickness of each of the several epitaxial layers. In addition it is desired that the transitions between layers - the hetero-interfaces - be abrupt. The present apparatus is intended to provide means for forming layers of this quality and multiple layer structures with abrupt hetero-interfaces.

The MOMBE technique incorporates the key advantages of two prior technologies; MOVPE (metal-organic vapor-phase-epitaxy) and MBE (molecular-beam-epitaxy).

MOVPE reactors generally provide good control and reproducibility of the molar flow of metal organic reagents. However, hydrodynamic processes such as gas-phase depletion, convection and turbulence occur in MOVPE reactors where the growth chamber pressures are typically from 0.1 to unity atmospheric pressure. At these pressures, the flow of the injected gases is viscous and can become turbulent, which limits the accuracy, uniformity and reproducibility of the epitaxial layers and of devices fabricated from these layers.

In MBE, hydrodynamic problems are eliminated by use of a vacuum (molecular flow regime) environment in the growth chamber using solid sources. However the uniformity, reproducibility and throughput are unfavorably affected by depletion effects in conventional solid sources.

MOMBE combines the accurately metered and long lived MO gas sources of MOVPE with the vacuum environment of MBE and has the potential for a higher uniformity, reproducibility and thoughput than either predecessor.

Apparatus optimized to carry out the MOMBE process is accordingly necessary for efficient MOMBE processing. Central to such apparatus is the manifold for delivery of MO reagents to the MOMBE growth chamber.

In particular, the manifold in MOMBE processing must maintain reasonably high MO molar flows with modest total gas flows. In MOMBE, the pressure in the growth chamber must remain below 10E-4 torr in order to maintain the molecular flow regime essential to uniformity i epitaxial layer formation. If excessive carrier gas flows are used, then the pumping speeds required to evacuate the reactor chamber to the required low pressure become prohibitive.

The maximum permissible total gas flow into the MOMBE chamber is approximately 50 standard cubic centimeters per minute (sccm), assuming currently available pumping speeds. In an MOVPE system, total gas flows of 10 standard liters/min (slm) (200 times greater than in MOMBE) are common and carrier flows in each bubbler are typically 50 to 100 sccm. When MO reagents having a low vapor pressure are used in MOVPE, the bubbler flow may be 400 sccm or even higher if an acceptable epitaxial growth rate is to be achieved. It is not possible to use such high bubbler flows in MOMBE processing. Accordingly, if low vapor pressure materials are to be used in MOMBE, the process conditions must be altered from the MOVPE processing conditions.

In short, in MOMBE processing, a manifold is required, which will inject adequate molar flow rates of the MO reagent, while using low carrier flow rates. In addition, the manifold should permit accurate metering of the MO molar reagents, and should accommodate reagents having low vapor pressures.

SUMMARY OF THE INVENTION

Accordingly, it is an object of the invention to provide an improved manifold for MOMBE processing.

It is another object of the invention to provide a manifold for MOMBE processing, having improved accuracy in metering epitaxial reagents.

It is still another object of the invention to provide a manifold for MOMBE processing, in which low vapor pressure reagents may be employed without requiring excessive pumping capacity for maintaining the MOMBE chamber at the vacuum required for molecular beam propagation.

It is a further object of the invention to provide a manifold for MOMBE processing in which transients occuring as the reagents are turned on and off are minimized to facilitate formation of uniform and reproduceable, thin epitaxial layers.

These and other objects of the invention are achieved in a novel Metal Organic Molecular Beam Epitaxy (MOMBE) apparatus comprising a manifold and a growth chamber.

The manifold, which is coupled to a supply line for carrier gas, includes a first and a second adjustable mass flow controller, each coupled to the supply line and a bubbler with a chamber for a vaporizable liquid reagent having an inlet coupled to the second controller (set to a mass flow rate (Fc)) and opening beneath the chamber filling level, an outlet disposed above the filling level to remove carrier gas borne reagent, the chamber being-temperature controlled to establish a desired vapor pressure (Pa) for the liquid reagent.

The manifold further includes a pressure sensor coupled to the bubbler outlet, and an adjustable needle valve also coupled to the bubbler outlet, the needle valve adjustment setting the bubbler outlet pressure (Pc) to a desired value.

The foregoing elements provide three parameter control of carrier borne reagent flow (Fa) in accordance with the following expression $$Fa = Fc/(Pc/Pa - 1).$$

The manifold further includes a vent line, a reactor line, and four ganged valves, the first pair of ganged valves opening together as the second pair of valves closes together. The valves are connected to supply reagent to the reactor line while a compensation flow is being supplied to the vent line, and vice versa. Adjustment of the mass flow controllers for equal gas flows thus maintains the total flow of gas into said vent and reactor lines substantially constant to minimize transients in the supply of reagent to the MOMBE reactor.

The MOMBE growth chamber includes an injector to which the reactor line is connected, and means to support and heat the substrate to facilitate formation of the epitaxial layer with carrier gas borne reagent. The growth chamber is evacuated at a rate which maintains a vacuum of $10^{-4}$ torr during admission of carrier gas to permit molecular beam propagation during epitaxial processing.

DESCRIPTION OF THE DRAWINGS

The inventive and distinctive features of the invention are set forth in the claims of the present application. The invention itself, however, together with further objects and advantages thereof may best be understood by reference to the following description and accompanying drawings, in which:

DESCRIPTION OF THE PREFERRED EMBODIMENT

Figure 1:
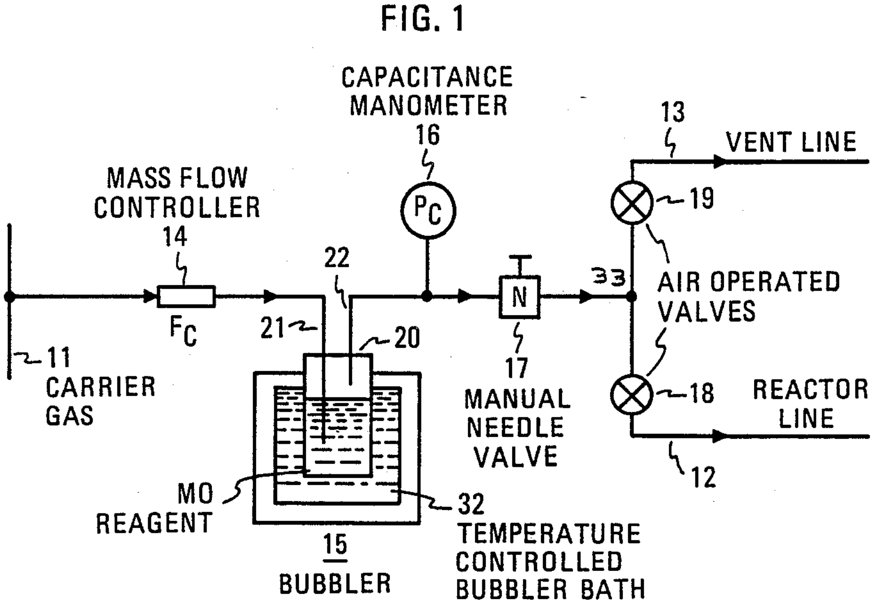
FIG. 1 is an illustration of a portion of a manifold for use in a metal organic molecular beam epitaxy (MOMBE) apparatus designed to control the supply of a carrier gas borne metal organic reagent to the MOMBE growth chamber, the control being achieved by adjustment of three parameters.

Referring now to FIG. 1, there is shown a portion of a manifold for use in a metal organic molecular beam epitaxy (MOMBE) apparatus and in which three parameter control of reagent injection is provided. The illustrated portion includes a manifold input line 11 to which a carrier gas, typically hydrogen at atmospheric or somewhat below atmospheric pressure, is supplied. The useful output of the manifold, which contains a carrier gas borne metal alkyl reagent, for example, is discharged into a reactor line 12. The reactor line 12 is coupled to an injector (not shown in this figure) for supply of the carrier gas borne reagent to a MOMBE growth chamber. The manifold also discharges into a vent line 13, where the flow of metal organic reagent can be stabilized and maintained until required for injection.

The portion of the manifold illustrated in FIG. 1 includes a mass flow controller 14, a metal organic reagent bubbler 15, which is charged with the liquid metal organic reagent, a capacitance manometer 16, a needle valve 17, and a pair of air operated valves 18 and 19 which are ganged so that when one member of the pair is opened, the other member is closed.

The inlet of the mass flow controller 14 is coupled to the supply line 11 to admit carrier gas. The supply line provides carrier gas at approximately atmospheric pressure. The mass flow controller 14 may be manually adjusted to set the flow of the carrier gas to a desired rate. Once set, the controller 14 automatically stabilizes the rate of flow to within plus or minus one half of a percent against customary upstream or downstream disturbances. The output pressure of the mass flow controller 14 is substantially less than the supply line pressure, with a typical rate of flow of 5 standard cubic centimeters per minute (sccm). The setting of the rate of flow is dependent on the reagent selected, and the requirements of the epitaxial process. The outlet of the mass flow controller is coupled to an inlet of a bubbler 15 containing the liquid metal organic reagent.

The bubbler 15 comprises a sealed cylindrical chamber 20, partially filled with the liquid reagent, set within a temperature controlled bath 32. The outlet of the mass flow controller 14, is coupled to the bubbler inlet 21, which opens into the chamber below the surface of the liquid and near the bottom of the chamber. This arrangement allows the carrier gas to bubble up through the reagent to facilitate saturation of the carrier gas by the reagent. An outlet 22 is provided having an opening in the chamber above the surface of the liquid. The outlet 22 couples the saturated carrier gas borne gaseous reagent to the capacitance manometer 16. The manometer 16 is connected via additional tubing to the manual needle valve 17.

The liquid content of the bubbler chamber is a vaporizable metal organic liquid which dissociates at a suitably high temperature into a metallic and an organic component as earlier discussed. Group III metals, Group V metals, p-dopants and n-dopants may be introduced into the growth chamber using metal organic liquids as sources.

Ordinarily separate injectors are used for each of the four classes of reagents. However, each injector may be required to process several reagents from each class. In such a case, there may be two or more paths in the manifold each traversing a separate bubbler to supply two or more reagents to one injector. (For clarity, a "manifold" supplies one injector, and may have more than one path through more than one bubbler leading to that injector. A growth chamber with plural injectors may require a like plurality of manifolds.) A suitable metal organic liquid for the Group III reagents may be triethyl-M or trimethyl-M, where M is the Group III element. A suitable metal organic liquid source of Group V atoms may take the form of tertiary-butyl-N or diethyl-N-hydride, where N is the Group V element. The high purity carrier gas may be either hydrogen, nitrogen or argon. The dopants may also be delivered into the MOMBE growth chamber using metal organic sources. These may be diethyl-beryllium or diethyl-zinc for the p-dopants, beryllium and zinc, respectively, or diethyl-tellurium or tetramethyl-silane for the n-dopants tellurium or silicon respectively.

The outlet of the bubble 15 is coupled via the manual needle valve 17 to a branch 33 in the tubing leading respectively to a first air operated valve 18 in the path to the reactor line 12 and to a second air operated valve 19 in the path to the vent line 13.

As earlier noted, the valves 18 and 19 are ganged to switch to opposite states, so that when the apparatus is in normal operation, and no reagent is being supplied to the injector, the tubing is conducting the carrier borne reagent to the vent line. Thus the tubing between the bubbler 15 and the branch 33 and between the branch 33 and the inlet to the valve 19 contains the carrier borne reagent flowing through. In addition, the tubing from the branch 33 to the inlet of the valve 18 normally fills with reagent although the contents are not in the path of principal flow during venting.

When it is desired to supply the reagent to the reactor line 12, which leads to the injector, the valve 19 is shutoff and the valve 18 is opened. Thus, because the tubing from the bubbler to the entrance of the valve 18 is already substantially filled, the reagent enters the reactor line 12 after an irreduceable delay, set primarily by the volume of the reactor line leading to the MOMBE growth chamber injectors. A transient, which is produced, is minimized by a compensation flow, which will subsequently be discussed. Care in these particulars affects the accuracy of metering the supply of reagent to the MOMBE growth chamber.

Figure 4:
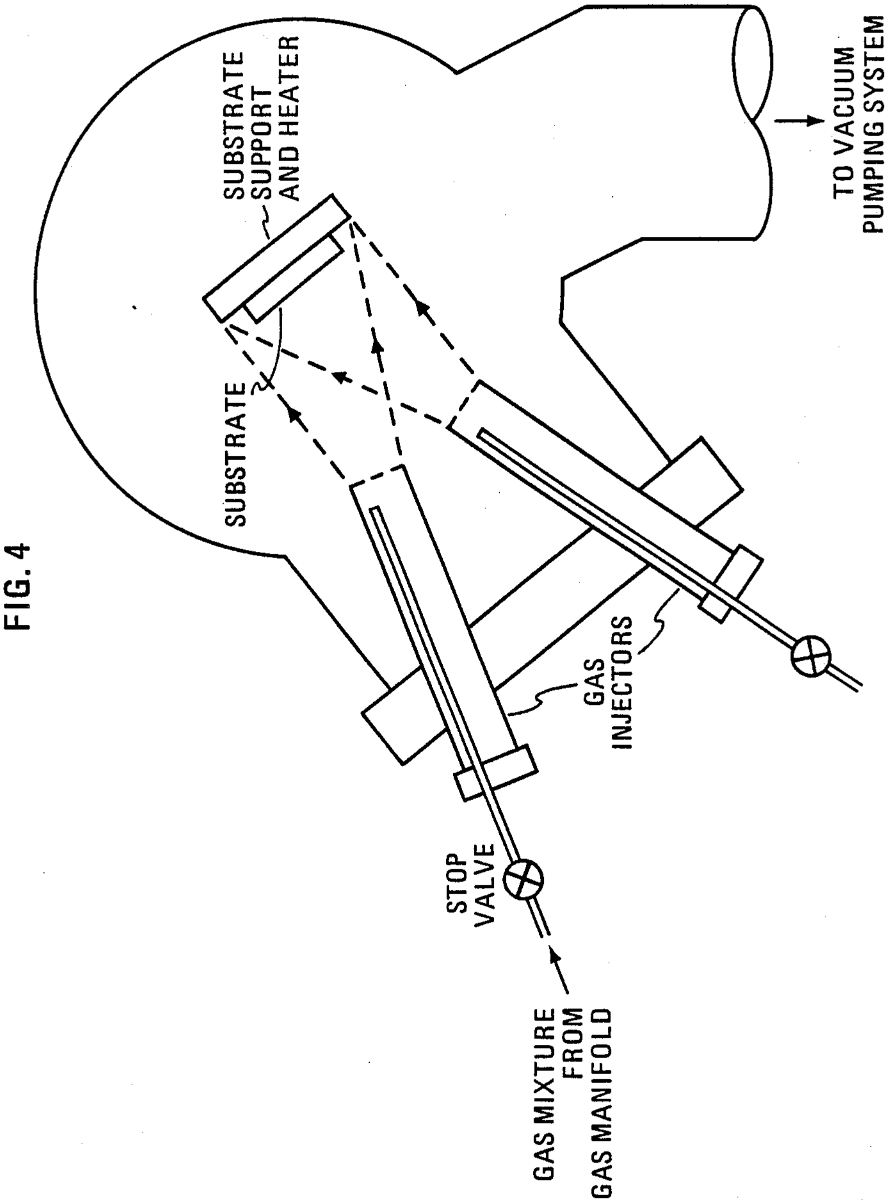
FIG. 4 is a simplified showing of a MOMBE growth chamber in which two injectors are illustrated, each of which may be supplied with reagent from a separate MOMBE manifold.

The pressure and temperature conditions in the manifold are controlled to sustain accuracy in the metering of the MO reagent as it leaves the bubbler and proceeds to the injector while using minimum carrier gas flow. The bubbler output is held at an accurately controlled variable temperature, typically near 0° C. The temperature is adjusted to control the saturated vapor pressure of the reagent, and thereby controls the pressure above the surface of the liquid in the bubbler. Typically this pressure will be within the range of one to 100 torr, as measured by the manometer 16 at the outlet of the bubbler. The needle valve 17, is used to manually adjust pressure within the bubbler to a desired value above the saturated vapor pressure and produces a second reduction in pressure to approximately 0.1 torr in the tubing at branch 33. At the injector for the MOMBE growth chamber (shown in FIG. 4), a further reduction in pressure occurs to approximately $10^{-5}$ torr.

In addition to the foregoing controls, the temperature of the manifold tubing from the outlet of the bubbler 15 to the injector is maintained at a sufficiently high temperature to prevent condensation of the reagent on the walls of the tubing, which would add uncertainty to the metering of the MO reagent supplied to the growth chamber. This temperature is typically from 50° to 80° C. The temperature of the substrate within the MOMBE chamber is from 200° C. to 800° C., depending upon the reaction taking place.

The flow of the MO reagent (Fa in sccm may be mathematically expressed as a function of the carrier gas flow (Fc) in sccm, the saturated vapor pressure (Pa) of the MO reagent in torr and the pressure in the bubbler chamber over the liquid (Pc) in torr. The expression is as follows:

$$Fa = Fc((Pc/Pa) - 1) \quad (1)$$

One may now consider manifold operation and the practical implications of expression 1. Assuming a manifold with operating vacuum pumps and no carrier gas being supplied, the space over the MO reagent within the bubbler chamber 20 is being evacuated continuously through the needle valve 17 and through one of the air operated valves 18 or 19 leading either to a vent or the growth chamber. The atmosphere over the MO reagent becomes pure MO vapor and the pressure (Pc) in the space over the MO reagent in the chamber 20 is attributable to the saturated vapor pressure (SVP) of the reagent. Assuming an adequate supply of liquid MO, the flow rate of MO reagent will reach a dynamic equilibrium in which an increase or decrease in temperature, will effect a proportional change in the vapor pressure of the MO and proportional change in the flow rate of MO reagent to the growth chamber. (The dynamic equilibrium approaches an equilibrium dictated by thermodynamic considerations as the flow rate of the MO reagent approaches zero.)

When a carrier gas, such as hydrogen, is introduced into the bubbler, passing through the MO reagent and sharing the space over the MO liquid with MO vapor, the atmosphere over the MO liquid becomes a mixture of carrier gas and MO vapor. Assuming a low, but fixed rate of introduction of carrier gas, a dynamic equilibrium is reached in the proportion of MO vapor to carrier gas and in the proportion of hydrogen gas dissolved in liquid MO.

The amount of carrier gas dissolved in the liquid MO is normally of lesser importance since the amount going into the solution is small, quickly stablizes, and does not substantially affect the rate of flow of carrier gas or MO to the growth chamber.

The proportion of MO vapor to carrier gas in the gaseous mixture is dependent on the evaporation and diffusion mechanisms both dependent in turn on temperature, pressure, and equipment design. These considerations are of importance since they determine the flow rate of MO reagent to the growth chamber. For modest rates of flow of carrier gas, the carrier gas is efficiently saturated with reagent vapor, however as the flow of carrier gas increases, the carrier gas will eventually leave the bubbler in an unsaturated condition.

The goal of the manifold design, where significant quantities of carrier gas are continuously introduced and both carrier gas and MO are removed, is to reach a predictable and stable, steady state condition, in a short time, commensurate with the times required to form the various steps in epitaxial processing. This stabilization of the reagent flow is carried out with the flow switched to the vent line of the manifold.

Evaporation of MO liquid and mixture of the gases is aided by optimizing the bubbler to provide maximum opportunity to the MO molecules to escape from the liquid state through the bubble membranes into the gaseous state in the bubbles as they percolate up through the liquid reagent.

After passage through the liquid reagent, the bubbler design should provide maximum opportunity for the mixed carrier gas and gaseous MO to continue the molecular exchange with the MO liquid through the liquid-gaseous interface at the surface of the liquid. A relatively large liquid surface facilitates faster steady state stabilization of the proportions of the gas mixture for a given carrier gas flow, and should insure that steady state conditions are quickly attained at the highest required rates of carrier gas flows (consistent with the growth chamber pumping capacity, a primary requirement for MOMBE operation).

The arrangement illustrated in FIG. 1 achieves full control of the MO molar flow by precise control of the hydrogen carrier gas flow (Fc), MO bubbler temperature which affects (Pa) and the setting of the needle valve 17 which controls the bubbler outlet pressure (Pc) (the three variables in expression 1).

The apparatus, as indicated by expression 1, provides sensitive control of the MO molar flow rates. Since the vent and reactor lines are held at a low pressure in relation to the partial pressure of the MO reagent, and the partial pressure of the MO reagent is lower than the pressure of the carrier gas supply line, the flow of carrier gas is continuous and at a rate set by the mass flow controller. In addition, obstruction of the flow of carrier gas by the needle valve N, permits one to control the pressure at the bubbler outlet (Pc). The amount of MO reagent carried by carrier gas may be regulated by adjusting the temperature of the liquid MO reagent to vary the vapor pressure (Pa) of the MO reagent in the bubbler. This sets the ratio of MO molecules to carrier gas molecules in the gas mixture delivered to the reactor or vent lines, the carrier gas flow being earlier established by the mass flow controller.

The hydrogen carrier gas flow is established at a maximum value consistent with maintaining the desired vacuum ($10^{-4}$ torr) in the growth chamber. While the number may vary somewhat from pumping system to pumping system, this sets a practical upper limit upon carrier gas flow of approximately 100 sccm. Customary carrier gas flows are from about 10 to 40 sccm for reasonable process speeds.

With low vapor pressure materials, such as TEAl, the settings of the mass flow controller for carrier gas flows (Fc) will ordinarily be required near the maximum permissible. Much lower carrier gas flows will be appropriate with high vapor pressure materials.

The ability to both raise the temperature to increase partial pressure (Pa) and to lower the pressure (Pc) at the bubbler outlet to a value above, but near to the vapor pressure gives one maximum freedom to accommodate low vapor pressure materials.

For example, with the triethyl-aluminum (TEAl) reagent, an elevated temperature of 50° C. produces a partial vapor pressure (Pa) of only 0.35 torr. The Pc under these circumstances, which is varied by adjusting the needle valve, may be set to produce pressures varying from 6 to 1 torr, to produce MO reagent flows of from $10^{17}$ to $4\times10^{19}$ molecules per minute.

Ordinarily molar flow rates of from $10^{16}$ to $10^{19}$ molecules per minute provide desirable growth rates over customary wafer dimensions. Desirable growth rates are those which permit the process to be completed with appropriate speed, and which permit accurate control of epitaxial thicknesses.

The manifold is adjusted to use the appropriate bubbler temperature consistent with these objectives, avoiding dissociation of the MO compounds within the bubbler. A range of from 50° C. to 80° C. represents the upper limit to the bubbler temperature with low vapor pressure reagents. Lower temperatures in the range of from 0° C. to 30° C. are preferred, and may be used with many common reagents.

The pressure in the bubbler is set above the vapor pressure of the MO reagent, normally at least double the vapor pressure, and substantially less than atmospheric pressure in the interest of maximizing the richness of the mixture of MO reagent to carrier gas.

Reducing the bubbler pressure Pc, with adequate heating to increase the vapor pressure (Pa) of the MO reagent therefore permits delivery of optimum molecular flow rates while using minimum carrier gas flow. (These measures are particularly useful for low vapor pressure materials which would otherwise require very large carrier flows, likely to be ruled out because of the pumping speed limitations of MOMBE equipment.)

The bubbler pressure PC is a powerful parameter in controlling the molar flow of the MO reagent. For instance, a variation from 6 to 1 torr produces a variation from $10^{17}$ to $4\times10^{18}$ molecules of triethylaluminum (TEAl) per sccm of carrier with a bubbler temperature of 50° C. and a Pa of 0.35 torr. Similarly, a variation from 230 to 20 torr produces a variation of from $10^{17}$ to $4\times10^{19}$ molecules of triethylgallium (TEGa) per sccm of carrier, with a bubbler temperature of 40° C. and a Pa of 14 torr.

The achieveable accuracy of the molar flow rates is $\pm0.5\%$ in the present three parameter control apparatus. For a given bubbler temperature, the carrier flow is first set and then the needle valve "N" is adjusted to give the desired value of pressure in the bubbler. The mass flow (Fc) is controlled to $\pm0.5\%$. The temperature is controlled to $\pm0.01°$ C. providing a control of the vapor pressure of the MO reagent of 0.05%.

The use of a three parameter control of MO flow therefore gives the present MOMBE manifold substantial flexibility. The arrangement allows the controlled delivery of useful molar flows of MO reagents having a wide range of vapor pressures without resorting to high source temperatures or high carrier gas flows.

Figure 2:
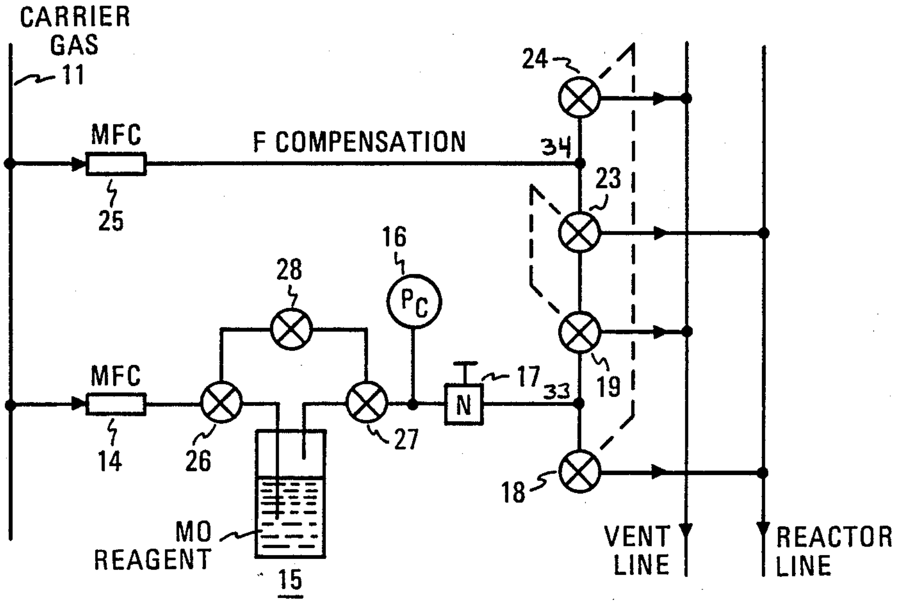
FIG. 2 is an illustration of a larger portion of a MOMBE manifold used to supply carrier gas borne metal organic reagent to a single injector of a MOMBE apparatus, the larger portion including a separate compensation flow to reduce transients arising from switching the carrier gas borne metal organic reagent on and off in injection.

The simplified arrangement illustrated in FIG. 1 is designed to maintain substantially equal flows of carrier gas through the bubbler with the carrier gas being supplied to the vent line or the reactor line. In practice, the vent lines and the reactor line experience increases and decreases in pressure as this switching takes place which affects Pc and therefore the accuracy of metering the molar flows of MO reagent. The arrangement illustrated in FIG. 2 provides a method of switched compensation flows which maintains the pressures in the vent and reactor lines substantially constant and equal as gas switching takes place and removes instability due to changes in pressure in the reactor and vent lines. It also removes instability due to changes in pressure in the carrier gas supply line.

The FIG. 2 arrangement comprises a "source flow" to which a parallelled compensation flow has been added. The source path leads from the carrier gas line 11 via the bubbler to the reactor and vent lines 12 and 13 respectively, and is similar to that illustrated in FIG. 1 except for the provision of additional valves 26, 27 and 28 about the bubbler, which are useful in setting up the manifold for operation. The compensation path comprises a mass flow controller 25 having its inlet connected to the carrier gas line and its outlet connected via a Tee 34 to the inlets of two valves 23 and 24. The outlets of the valves 23 and 24 are connected respectively to the reactor line and the vent line.

In addition, the compensation path valves 23 and 24 in the FIG. 2 arrangement are ganged with the "source" valves 18 and 19 in the bubbler path in an opposite sense. In particular, the valve 23 is arranged to open when the valve 19 opens and to close when valve 19 closes. Similarly, the valve 24 is designed to open when the valve 18 pens and to close when the valve 18 closes. Consistent with opposite states in source and compensation paths, the closing of valves 19, 23 is accompanied by the opening of valves 18, 24, and vice versa. The reversal of connections of the source and compensation paths to the reactor and vent lines, and the ganging of the four valves causes the flow in the source path (via the bubbler) to be to the vent line, when the flow in the compensation path is to the reactor line (and vice versa).

The four valves are thus operated simultaneously so that when the source flow via the bubbler is added to the reactor line and the equivalent compensation flow is subtracted from the reactor line and the flows are adjusted to be equal, the total flow, and the pressure in both the reactor and vent lines remains constant during switching effectively eliminating the flow transients. In addition, the flow in the carrier gas line is also stabilized. Experience with this approach indicates greater stability than with an automatic pressure control system (APC). The latter, which provides pressure control after a small time delay in a feedback loop during which the transients are stabilizing tends to have a greater switching discontinuity than occurs when the paired pneumatic valves are switched to opposite states.

Figure 3:
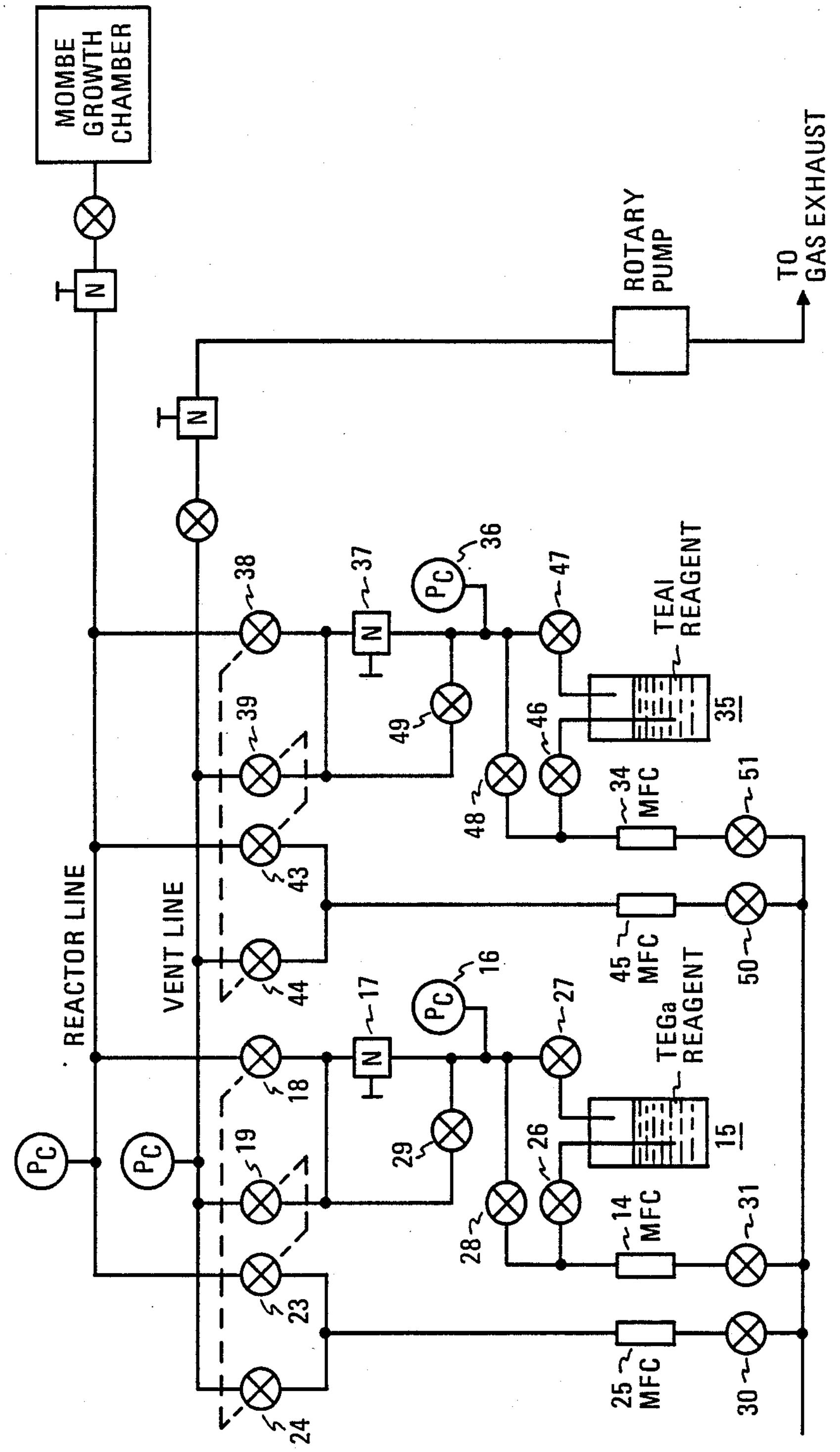
FIG. 3 is an illustration of a MOMBE manifold supplying too metal organic reagents to a single injector of a MOMBE growth chamber.

A more extensive view of a MOMBE manifold is illustrated in FIG. 3. Here two bubblers 15 and 35 are provided for supplying EEGa and TEAl, respectively, to an injector to the MOMBE growth chamber. It should be understood that other MOMBE manifolds may be require to supply the other injectors in a growth chamber. Typically there will be at least four injectors, each usually requiring a manifold. One injector and manifold will be provided for Group III MO reagents, and one injector and manifold for Group V MO reagents. An injector, not necessarily entailing a bubbler manifold may be provided for p-dopants and another injector not necessarily entailing a bubbler manifold may be provided for n-dopants.

Returning now to FIG. 3, the illustrated MOMBE manifold is formed of two substantially identical portions, each portion formed about one of the bubblers 15 and 35. A single MOMBE manifold may conveniently accommodate two or three "bubblers". Ordinarily, if more than three otherwise compatible MO reagents are desired, a second manifold will be provided coupled to another injector. A typical growth chamber provides at least eight injectors, each of which may be fed from manifolds of the type herein disclosed.

What is claimed is:

1. In a Metal Organic Molecular Beam Epitaxy (MOMBE) apparatus, the combination comprising:

A. a manifold including (1) a supply line for carrier gas under pressure, (2) a first and a second adjustable mass flow controller with an input and output, the inputs being coupled to said supply line for admitting said carrier gas at desired rates of flow (Fc), (3) a bubbler with a chamber for a vaporizable liquid reagent having an inlet coupled to said second controller output, opening beneath the chamber filling level for bubbling carrier gas through liquid reagent and an outlet disposed above said level to remove carrier gas borne reagent, and an adjustable temperature control for establishing the vapor pressure (Pa) of said liquid reagent, (4) pressure sensing means coupled to the bubbler outlet to sense the pressure (Pc), (5) an adjustable needle valve having a high pressure input port, a low pressure output port, the high pressure input port being coupled to said bubbler outlet, the needle valve adjustment setting the outlet pressure at a desired value, the foregoing elements providing three parameter control of carrier borne reagent flow (Fa) to the low pressure port of said needle valve in accordance with the following expression $$Fa = Fc/(Pc/Pa - 1)$$

(6) a vent line, (7) a reactor line, and (8) four ganged valves (24, 18; 23, 19), the first pair of valves (24, 18) opening together as the second pair of valves (23, 19) closes together, and the first pair closing together as the second pair opens together, the first valves (24, 23) in the first and second pairs each having one port coupled to the output port of said first mass flow controller and the other port to said vent line and reactor line, respectively, the second valves (18, 19) in the first and second pairs each having one port coupled to the output port of said needle valve and the other port to said reactor line and vent line, respectively, adjustment of said mass flow controllers for equal gas flows maintaining the total flow of gas into said vent and reactor lines substantially constant to minimize valve switching transients, and B. a MOMBE growth chamber having (1) an injector to which said reactor line is connected, (2) means to support a substrate upon which an epifaxial layer is to be formed within said chamber, (3) means to heat said substrate to facilitate formation of said epitaxial layer with said carrier gas borne reagent, and (4) means to evacuate said growth chamber at a rate which will maintain said growth chamber at a low pressure during admission of carrier gas at which substantially all of the molecules of carrier gas borne reagent, which impact the substrate, do so without prior collision.

2. The arrangement set forth in claim 1 wherein the pressure in the carrier gas input line is less than atmospheric pressure, the pressure at the bubbler outlet is set to exceed the vapor pressure of contained MO reagent, and to be less than the pressure at the carrier gas inlet line, and the pressure in the growth chamber is $10^{-4}$ torr or less to facilitate the continuous flow of carrier gas from supply line to vent or reactor line.

3. The arrangement set forth in claim 1 wherein the bubbler temperature is upwardly adjustable short of dissociation of the MO reagent to increase the partial pressure (Pa) of a liquid MO reagent, and the bubbler outlet pressure (Pc) is downwardly adjustable toward the vapor pressure of the liquid MO reagent to increase the richness of the mixture of MO vapor to carrier gas, to allow the manifold to process MO reagents having low vapor pressures at reasonable flow rates.

4. In an epitaxial processing apparatus, the combination comprising:

A. a manifold including (1) a supply line for carrier gas under pressure, (2) a first and a second adjustable mass flow controller with an input and output, the inputs being coupled to said supply line for admitting said carrier gas at desired rates of flow (Fc), (3) a bubbler with a chamber for a vaporizable liquid reagent having an inlet coupled to said second controller output opening beneath the chamber filling level for bubbling carrier gas through liquid reagent and an outlet disposed above said level to remove carrier gas borne reagent, and an adjustable temperature control for establishing the vapor pressure (Pa) of said liquid reagent, (4) pressure sensing means coupled to the bubbler outlet to sense the pressure (Pc), (5) an adjustable needle valve having a high pressure input port, a low pressure output port, the high pressure input port being coupled to said bubbler outlet, the needle valve adjustment setting the outlet pressure at a desired value, the foregoing elements providing three parameter control of carrier borne reagent flow (Fa) to the low pressure port of said needle valve in accordance with the following expression $$Fa = Fc/(Pc/Pa - 1)$$

(6) a vent line, (7) a reactor line, and (8) four ganged valves (24, 18; 23, 19), the first pair of valves (24, 18) opening together as the second pair of valves (23, 19) closes together, and the first pair closing together as the second pair opens together, the first valves (24, 23) in the first and second pairs each having one port coupled to the output port of said first mass flow controller and the other port to said vent line and reactor line, respectively, the second valves (18, 19) in the first and second pairs each having one port coupled to the output port of said needle valve and the other port to said reactor line and vent line, respectively, adjustment of said mass flow controllers for equal gas flows maintaining the total flow of gas into said vent and reactor lines substantially constant to minimize valve switching transients.

5. The arrangement set forth in claim 4 wherein the pressure in the carrier gas input line is less than atmospheric pressure, the pressure at the bubbler outlet is set to exceed the vapor pressure of contained M reagent, and to be less than the pressure at the carrier gas inlet line, and the pressure in the growth chamber is $10^{-4}$ torr or less to facilitate the continuous flow of carrier gas from supply line to vent or reactor line.

6. The arrangement set forth in claim 4 wherein the bubbler temperature is upwardly adjustable short of dissociation of the MO reagent to increase the partial pressure (Pa) of a liquid MO reagent, and the bubbler outlet pressure (Pc) is downwardly adjustable toward the vapor pressure of the liquid MO reagent to increase the richness of the mixture of MO vapor to carrier gas, to allow the manifold to process MO reagents having low vapor pressures at reasonable flow rates.

* * * * *